United States Patent
Tokito et al.

(10) Patent No.: US 7,545,670 B2
(45) Date of Patent: Jun. 9, 2009

(54) DUAL WORD LINE OR FLOATING BIT LINE LOW POWER SRAM

(75) Inventors: Shunsaku Tokito, Tokyo (JP); Atsushi Hayashi, Kanagawa-ken (JP)

(73) Assignee: Sony Computer Entertainment Inc., Tokyo (JP)

( * ) Notice: Subject to any disclaimer, the term of this patent is extended or adjusted under 35 U.S.C. 154(b) by 0 days.

(21) Appl. No.: 11/775,546

(22) Filed: Jul. 10, 2007

(65) Prior Publication Data

US 2009/0016122 A1  Jan. 15, 2009

(51) Int. Cl.
*G11C 11/40* (2006.01)
(52) U.S. Cl. ...................... 365/154; 365/156
(58) Field of Classification Search ................. 365/156
See application file for complete search history.

(56) References Cited

U.S. PATENT DOCUMENTS

| | | | | |
|---|---|---|---|---|
| 5,040,146 A | * | 8/1991 | Mattausch et al. | 365/154 |
| 5,774,393 A | * | 6/1998 | Kuriyama | 365/156 |
| 6,097,651 A | * | 8/2000 | Chan et al. | 365/203 |
| 7,313,012 B2 | * | 12/2007 | Chuang et al. | 365/154 |
| 7,362,606 B2 | * | 4/2008 | Chuang et al. | 365/154 |
| 7,480,170 B1 | * | 1/2009 | Adams et al. | 365/154 |

* cited by examiner

*Primary Examiner*—Tan T. Nguyen
(74) *Attorney, Agent, or Firm*—Matthew B. Dernier, Esq.; Gibson & Dernier LLP

(57) ABSTRACT

Methods and apparatus provide for writing data into and reading data from an anti-parallel storage circuit of an SRAM memory cell via a true bit line (BLT) and a complementary bit line (BLC); and preventing the complementary bit line (BLC) from substantially dropping from a pre-charge level during operations in which a logic one is read from the anti-parallel storage circuit.

14 Claims, 6 Drawing Sheets

102

DUAL WORD LINE OR FLOATING BIT LINE LOW POWER SRAM

BACKGROUND

The present invention relates to methods and apparatus for controlling static random access memory (SRAM), and in particular for reducing the power dissipation of the SRAM using novel circuit techniques.

With reference to FIGS. 1A-1B, SRAM memory cells store data in the form of complementary low voltage and high voltage at opposite sides of the cell. An SRAM, unlike dynamic random access memory (DRAM), maintains the data content of the memory cells as long as power is applied to the cell. DRAM memory cells, on the other hand, are periodically refreshed with the stored data content. An SRAM cell includes a "true" node associated with a bit line (BLT) of the SRAM memory and a complementary node associated with a complementary bit line (BLC) of the SRAM memory. When the true node is read as a high voltage, the value of the SRAM memory cell is digital one. If the true node is read as a low voltage, the value of the SRAM memory cell is a digital zero.

During write and read cycles, a conventional SRAM memory system will employ a pre-charge circuit (among the circuits labeled other circuits) to drive the bit line BLT and the complementary bit line BLC to a power supply voltage of the SRAM memory, Vdd, before data is written to the memory cell. During the time that the data is actually written to the SRAM memory cell, a write buffer drives the bit line BLT and the complementary bit line BLC. During the read operation, the active components of the SRAM memory cell itself will drive the bit line BLT, which is sensed (using so-called evaluation circuitry) to determine the value of the stored data bit in the cell.

The conventional circuitry for accessing (or evaluating) the contents of each memory cell via the bit line BLT includes combinational logic and/or transistor circuitry to mirror the stored data value onto a global bit line (GBL). The conventional evaluation circuitry includes a portion 120 for charging the GLB and a portion 110 for interfacing a respective BLT line to the GBL. Thus, the conventional evaluation circuitry includes a plurality of interface portions (one portion for each BLT of a word line) and a single charging portion for the word line.

With reference to FIG. 1B, the conventional circuitry for implementing the BLT and BLC as well as the evaluation circuitry results in a BLC voltage potential that drops (see dashed line) well below Vdd during a read operation when a logic 1 (high voltage) is stored in the memory cell. Concurrently, the GBL remains high. Thus, the power dissipation (particularly during successive "read 1" cycles) is significant.

The power dissipation problem becomes significantly worse as the frequency of the clock increases and the size of the SRAM increases, which is an ongoing circumstance as higher and higher memory performance remains a design goal. Accordingly, there is a need in the art for a new approach to controlling SRAM memory cells in order to counteract the increase in power dissipation resulting from higher and higher clock frequencies and larger and larger SRAM memories.

SUMMARY OF THE INVENTION

In accordance with one or more embodiments of the invention, two word line gating signals are provided, one "read-write" word line (RWWL) to control the series transistor associated with the BLT bus, and one "write" word line (WWL) to control the series transistor associated with the BLC bus. The RWWL goes active for read or write operations, but the WWL goes active only for write operations. In an ideal case (where no loading exists from pre-charge circuits, write driver circuits, evaluation circuits, etc.) there would be no swing of the BLC bus during a read (data=1) operation. The invention contemplates a number of implementations of the pre-charge circuits, write driver circuits, and evaluation circuits that, while resulting in less than ideal (no swing) characteristics of the BLC bus, nevertheless significantly improve the power dissipation resulting from read (data=1) operations.

In accordance with one or more embodiments of the present invention, methods and apparatus provide for writing data into and reading data from an anti-parallel storage circuit of an SRAM memory cell via a true bit line (BLT) and a complementary bit line (BLC), while preventing the complementary bit line (BLC) from substantially dropping from a pre-charge level during operations in which a logic one is read from the anti-parallel storage circuit.

In accordance with one or more embodiments of the present invention, an SRAM cell includes: an anti-parallel storage circuit operable to store a logic high or low value across a true node and a complementary node; at least one first transistor coupled between the true node and a true bit line (BLT) of the SRAM cell; and at least one second transistor coupled between the complementary node and a complementary bit line (BLC) of the SRAM cell, wherein the first and second transistors are controlled by separate signals. The second transistor is controlled by a write word line (WWL) that turns the second transistor on only during operations in which a logic value is written into the anti-parallel storage circuit. The first transistor is controlled by a read-write word line (RWWL) that turns the first transistor on during operations in which a logic value is written into, or read from, the anti-parallel storage circuit.

The separate signals control the first and second transistors such that the complementary bit line (BLC) does not substantially drop from a pre-charge level during operations in which a logic one is read from the anti-parallel storage circuit.

In accordance with one or more embodiments of the present invention, an SRAM memory system includes: a plurality of memory cells arranged in an array of rows (word lines) and columns (bit lines); an anti-parallel storage circuit located in each memory cell and operable to store a logic high or low value across a true node and a complementary node; a set of first transistors, each first transistor coupled between the true node and a true bit line (BLT) of a respective SRAM memory cell; and a set of second transistors, each second transistor coupled between the complementary node and a complementary bit line (BLC) of a respective SRAM memory cell, wherein the sets of first and second transistors are controlled by separate signals. The separate signals control the sets of first and second transistors such that the complementary bit line (BLC) of the respective memory cells does not substantially drop from a pre-charge level during operations in which a logic one is read from the anti-parallel storage circuit.

In accordance with one or more embodiments of the present invention, an SRAM memory system includes: a plurality of memory cells arranged in an array of rows (word lines) and columns (bit lines); an anti-parallel storage circuit located in each memory cell and operable to store a logic high or low value across a true node and a complementary node, the true node and the complementary node receiving data from and providing data to a true bit line (BLT) and a complementary bit line (BLC), respectively; and a plurality of evaluation circuits, each operable to provide at least one of pre-charge, write driver, and feedback functions to an associated memory cell or group of memory cells, wherein at least one of the evaluation circuits is operable to prevent the complementary bit line (BLC) of an associated one of the memory cell from substantially dropping from a pre-charge level during operations in which a logic one is read from the anti-parallel storage circuit.

The evaluation circuit is operable to cause the complementary bit line (BLC) of the associated memory cell to float during operations in which a logic one is read from the anti-parallel storage circuit. For example, the evaluation circuit is operable to cause the complementary bit line (BLC) to float at a potential between a supply voltage, Vdd, and a ground potential, Vss. The floating potential may be about half of the difference of Vdd and Vss, or about a voltage threshold level below Vdd.

The evaluation circuit may include: at least one first transistor coupled from a supply voltage potential Vdd to the complementary bit line BLC; and at least one second (NMOS) transistor coupled from the complementary bit line BLC to a ground potential Vss, wherein: the first transistor is controlled by a write complement signal WC, which indicates that the data to be written into the anti-parallel storage circuit is opposite to a pre-charge logic value; and the second transistor is controlled by a write true signal, which indicates that the data to be written into the anti-parallel storage circuit is at the pre-charge logic value.

The first and second transistors may be controlled such that the complementary bit line (BLC) of the associated memory cell floats during operations in which a logic one is read from the anti-parallel storage circuit. The first transistor may be a PMOS transistor; and the floating potential about half of the difference of Vdd and Vss. The evaluation circuit may further include: a third (PMOS) transistor coupled from Vdd to the bit line BLT; and a fourth (NMOS) transistor is coupled from the bit line BLT to the WC line, wherein the third and fourth transistors are controlled by a signal indicating a pre-charge condition.

Alternatively, the first transistor of the evaluation circuit may be an NMOS transistor; and the floating potential about one voltage threshold level of the first transistor below Vdd. The evaluation circuit may further include: a third (PMOS) transistor coupled from Vdd to the bit line BLT; and a fourth (NMOS) transistor coupled in series with a fifth (NMOS) transistor, and the pair coupled from the bit line BLT to Vss, wherein the third and fourth transistors are controlled by a signal indicating a pre-charge condition, and the fifth transistor is controlled by the WC signal.

Other aspects, features, advantages, etc. will become apparent to one skilled in the art when the description of the invention herein is taken in conjunction with the accompanying drawings.

BRIEF DESCRIPTION OF THE DRAWINGS

For the purposes of illustrating the various aspects of the invention, there are shown in the drawings forms that are presently preferred, it being understood, however, that the invention is not limited to the precise arrangements and instrumentalities shown.

DETAILED DESCRIPTION OF THE PRESENT INVENTION

Figure 1A:
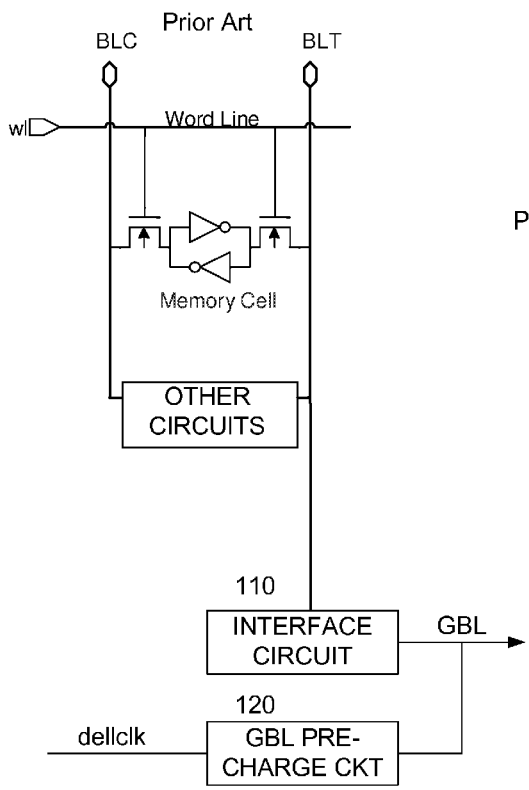
FIG. 1A is a block diagram illustrating an SRAM memory cell and evaluation circuit in accordance with the prior art.
Figure 1B:
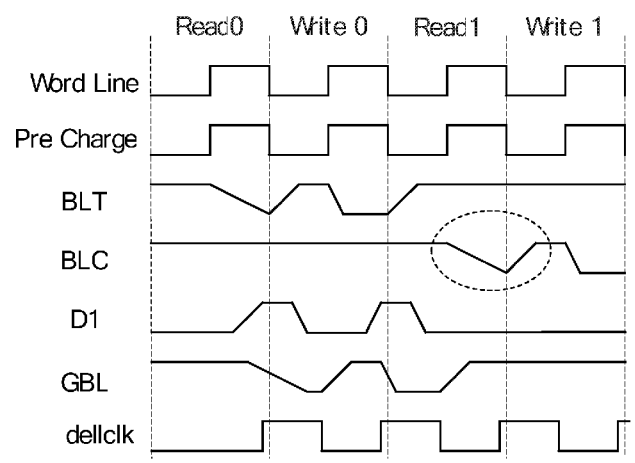
FIG. 1B is a graph illustrating timing relationships among numerous signals in the SRAM memory cell of FIG. 1A.
Figure 2:
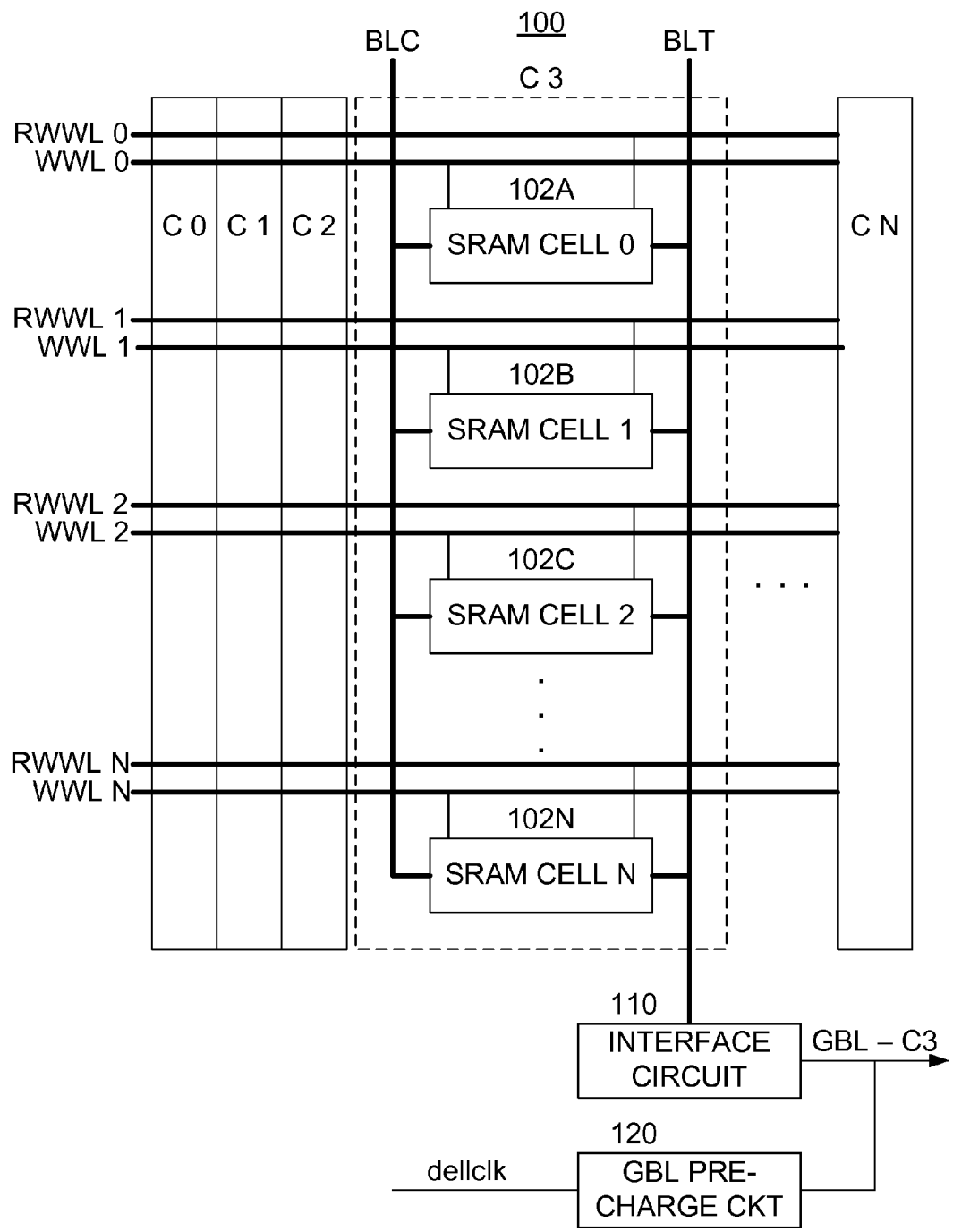
FIG. 2 is a block diagram illustrating an SRAM memory system in accordance with one or more embodiments of the present invention.

With reference to the drawings, wherein like numerals indicate like elements, there is shown in FIG. 2 an SRAM memory system 100 that may be adapted for carrying out one or more features of the present invention. For the purposes of brevity and clarity, the block diagram of FIG. 2 will be referred to and described herein as illustrating an apparatus 100, it being understood, however, that the description may readily be applied to various aspects of a method with equal force.

The SRAM memory system 100 includes a plurality of SRAM memory cells 102A-N arranged in an array of rows and columns. In general, each row in the array represents a word of data (such as 128 bits in width), and each column in the array represents a given bit position within each word of data. In contrast to the prior art systems, each word on the SRAM memory system 100 is accessed by activating one and/or another of two associated word lines (RWWL) and (WWL), along with the bit lines (BLC and BLT). The BLT is the "true" bit line and the BLC is the complementary bit line of the given column, e.g., C3, of the SRAM memory 100. When the true node (or true bit line) is read as a high voltage, the value of the accessed SRAM memory cell 102 is digital one. If the true node is read as a low voltage, the value of the SRAM memory cell 102 is a digital zero.

Although not shown in FIG. 2, one skilled in the art will appreciate that a number of further components of the SRAM memory system 100 may be employed, such as read and write pre-charge circuits, a write buffer (driver), feedback circuitry, and further components of a sense amplifier, etc. (Embodiments of these circuits, however, are shown and described later herein.)

An interface circuit 110 is employed to determine the logic state of the BLT, for example by sensing the voltage potential of the BLT with respect to ground during a read operation. During the read/write operation, the BLT BLC bit lines are pre-charged and then the active components of the SRAM memory cell 102 drive the BLT line, which in turn drives the interface circuit 110. The interface circuit 110 provides a higher drive capability to establish the logic value on the global bit line GBL, in this case for column three (C3) of the SRAM memory system 100. A global bit line pre-charge circuit 120 is also employed to drive the global bit line (in this case the GLB for column 3) to a pre-charge logic value in response to a clock signal (dellclk), which may be derived from the system clock.

Figure 3A:
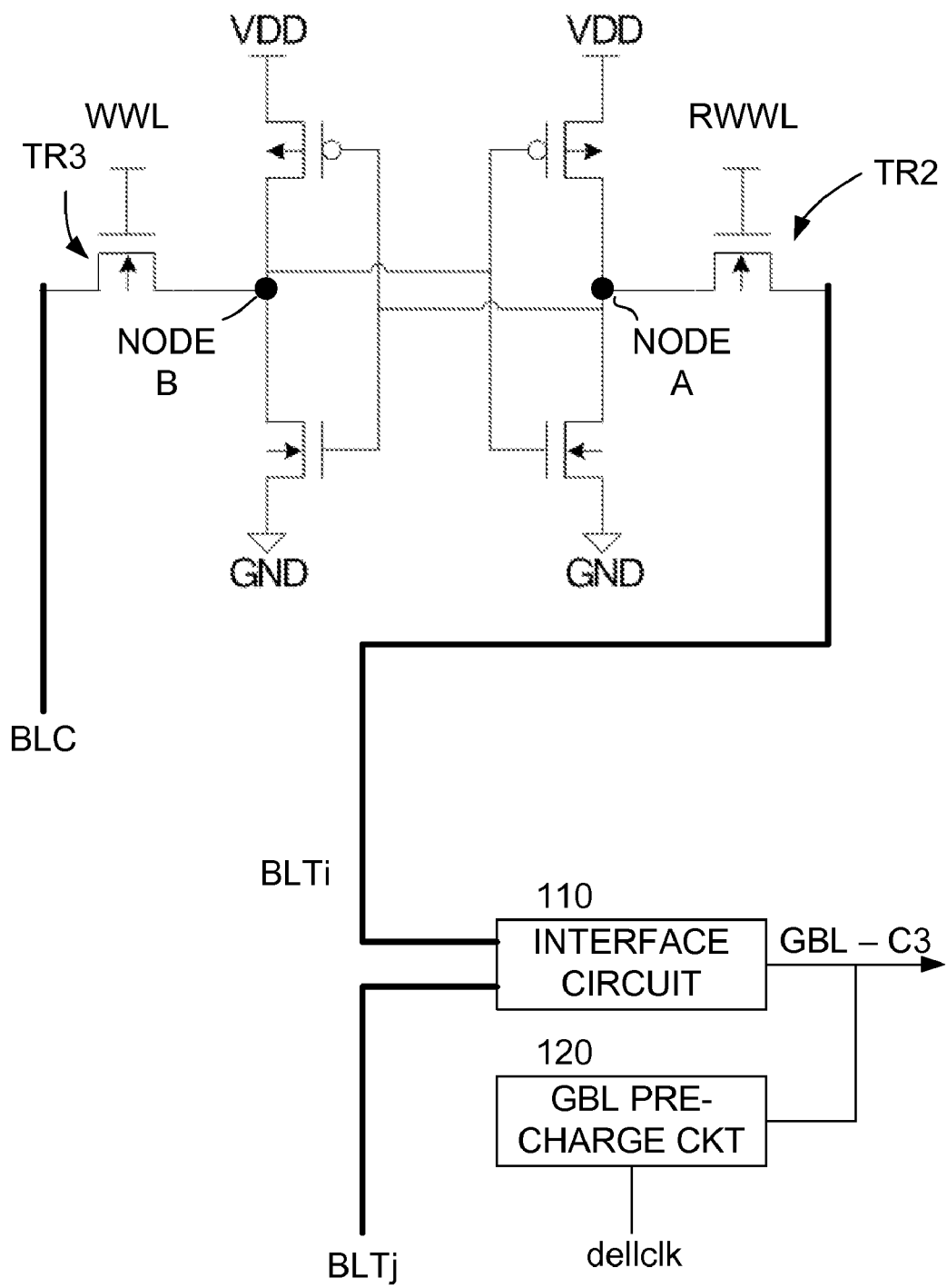
FIG. 3A is a detailed circuit schematic of an embodiment of an SRAM memory cell suitable for use with the system of FIG. 1 and other embodiments herein.
Figure 3B:
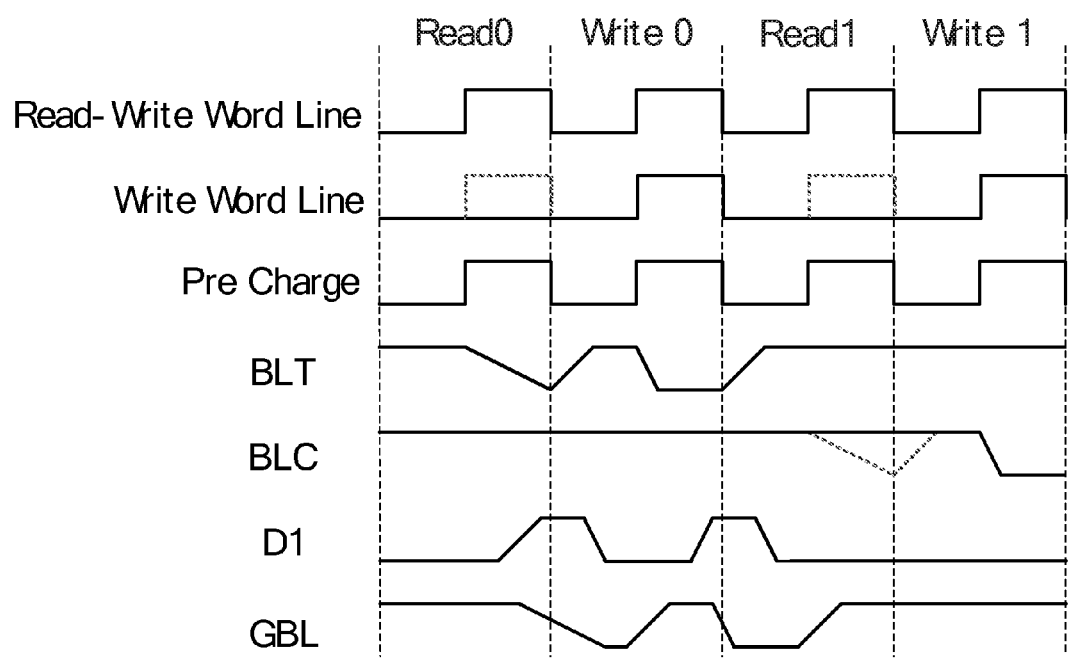
FIG. 3B is a graph illustrating timing relationships among numerous signals in the SRAM memory cell of FIG. 3A.

With reference to FIGS. 3A-3B, a detailed circuit schematic of an SRAM memory cell 102 is illustrated that is suitable for use in the system 100. The SRAM memory cell 102 includes a pair of inverters (or gates) arranged in an anti-parallel configuration. The anti-parallel inverters are implemented using a plurality of (field effect transistors) FETs interconnected such that storage nodes A, B are associated with true bit line BLT and complementary bit line BLC, respectively. For the purposes of illustration, it is assumed that node A is a "true" node and node B is a "complementary" node, which are coupled to the true bit line BLT and the complementary bit line BLC by way of respective NMOS transistors TR2 and TR3. It is noted that while NMOS technology is a preferred implementation for transistors TR2 and TR3, other technologies may be employed without departing from the embodiments of the invention.

The NMOS transistors TR2 and TR3 are controlled by a separate word line signals, WWL and RWWL, which also activate a plurality of SRAM memory cells used to store a single word of data. As will be discussed in further detail below, the WWL signal is preferably active for a write operation only, while the RWWL is preferably active for both read and write operations. The SRAM memory cell 102 includes a PMOS transistor and an NMOS transistor connected in series across the power supply potential, Vdd to Vss (or ground). The true node A is located at the common connection between the PMOS and NMOS transistors. A second set of PMOS and NMOS transistors are interconnected to produce the complementary node B. Again, although this specific circuit topology and implementation is suitable for carrying out one or more embodiments of the invention, those skilled in the art will recognize from the description herein that other implementations are within the scope of the invention.

With further reference to the timing signals of FIG. 3B, a bit of data is written to the SRAM memory cell 102 (Write 0 or Write 1) by turning on the respective NMOS transistors via the word lines WWL, RWWL, and presenting a voltage potential across the bit line BLT and the complementary bit line BLC. The voltage potential across the bit line BLT and the complementary bit line BLC is produced via a write driver circuit that will be discussed in later embodiments herein. A high voltage potential (e.g., Vdd) on the true node A and a relatively low voltage potential (e.g., ground) on the complementary node B is interpreted as a logic high or digital one (Write 1). Conversely, a relatively low voltage potential on the true node A and a relatively high voltage potential on the complementary node B is interpreted as a logic low or digital zero (Write 0). It is noted that the read and write pre-charge circuits (not shown) operate to drive the voltage on the bit line BLT and the complementary bit line BLC to certain voltage potentials prior to a read operation or a write operation to the SRAM memory cell 102.

During a write operation in which a logic high is written to the memory cell 102 (Write 1), the bit line BLT is driven to the Vdd potential and the complementary bit line BLC is driven to Vss (e.g., ground). Under these conditions, the PMOS transistor associated with the true node A will turn on, the NMOS transistor associated with the true node A will turn off, the PMOS transistor associated with the complementary node B will turn off, and the NMOS transistor associated with the complementary node B will turn on. Thus, the true node A will be substantially at the Vdd voltage potential and the complementary node B will be substantially at the Vss (or ground) voltage potential.

Those skilled in the art will appreciate that an opposite condition will be achieved during a write operation in which a logic low is written to the memory cell 102 (Write 0). The voltage potentials driving the bit line BLT and the complementary bit line BLC are reversed during a write 0 operation (as compared with a write 1 operation). The bit line BLT is driven to the Vss potential (e.g., ground) and the complementary bit line BLC is driven to Vdd. Under these conditions, the PMOS transistor associated with the true node A will turn off, the NMOS transistor associated with the true node A will turn on, the PMOS transistor associated with the complementary node B will turn on, and the NMOS transistor associated with the complementary node B will turn off. Thus, the true node A will be substantially at the Vss voltage potential and the complementary node B will be substantially at the Vdd voltage potential.

During a read operation in which a logic low has been stored in the memory cell 102 (Read 0), the bit line BLT and the complementary bit line BLC are pre-charged to Vdd prior to the RWWL going high. Then RWWL goes high and WWL remains low, which causes the transistor TR2 associated with the true node A to turn on and the transistor TR3 associated with the complementary node B to remain off. Thus, the voltage potential between nodes A-B drives the bit line BLT towards Vss (e.g., ground).

During a read operation in which a logic high has been stored in the memory cell 102 (Read 1), the bit line BLT and the complementary bit line BLC are pre-charged to Vdd prior to the RWWL going high. Then RWWL goes high and WWL remains low, which again causes transistor TR2 to turn on and transistor TR3 to remain off. Thus, the voltage potential between nodes A-B drives the bit line BLT high, which is the same level as the pre-charge potential Vdd. Since WWL remains low and transistor TR3 remains off, however, the complementary bit line BLC does not drop below Vdd. Therefore power dissipation is reduced and power savings is achieved.

Figure 4B:
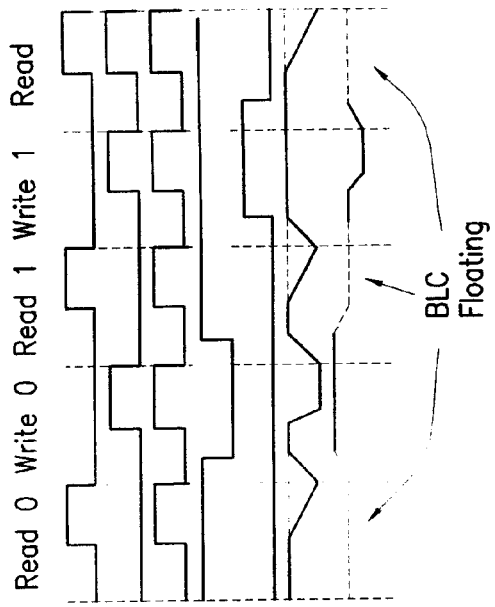
FIG. 4B is a graph illustrating timing relationships among numerous signals in the system of FIG. 4A.
Figure 4A:
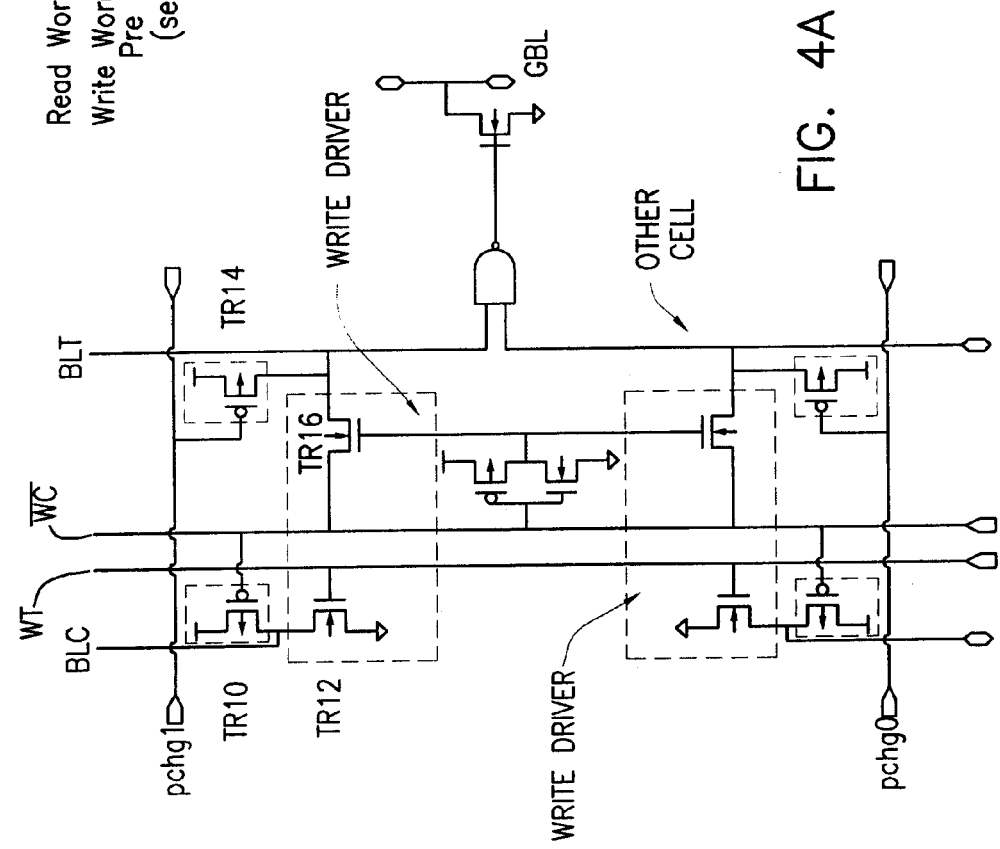
FIG. 4A is a block diagram illustrating a local evaluation circuit (feedback circuit and pre-charge circuit) suitable for use in an SRAM memory of any of the embodiments herein in accordance with one or more embodiments of the present invention.

Reference is now made to FIG. 4A, which is a detailed circuit diagram and block diagram of the memory system 100 in accordance with a further embodiment of the present invention. It is noted that the circuit details of the SRAM memory cell 102 are omitted for purposes of brevity and clarity. The feedback, pre-charge, and write driver circuits (collectively the evaluation circuit) are shown in more detail as being implemented by a plurality of NMOS and PMOS transistors. In operation, the evaluation circuit permits the complementary bit line BLC to float (driven to neither the Vdd nor Vss potential) during Read 0 and Read 1 operations. In this embodiment, the floating potential is about half way between Vdd and Vss. This advantageously prevents the complementary bit line BLC from swinging during read cycles, thereby reducing power consumption and dissipation.

This embodiment of the evaluation circuit includes PMOS transistor TR10, NMOS transistor TR12, PMOS transistor TR14, and NMOS transistor TR16. Transistor TR10 is coupled from Vdd to the complementary bit line BLC, and transistor TR12 is coupled from the complementary bit line BLC to Vss (in this case ground). Transistor TR10 is controlled (gated) by the WC-bar signal (the inverted WC signal), while transistor TR12 is controlled by the WT signal. The signal WC is indicative of a write operation in which the logic value to be written is opposite to the pre-charge logic value. The WC and WT signals are produced by the system in which the apparatus 100 is used, and they indicate whether a logic low or high is to be written. Transistor TR14 is coupled from Vdd to the bit line BLT, and transistor TR16 is coupled from the bit line BLT to the WC-bar line. Transistor TR14 is controlled by the pre-charge signal (pchgl). Transistor TR16 is controlled by the WC signal (an inverted version of the WC-bar signal) via the MOS inverter circuit.

With reference to FIG. 4B, during a Read 0, both the WC and WT lines are low (with WC-bar high). Thus, transistors TR10 and TR12 are off and the complementary bit line BLC is floating. During a Write 0, the WC line is high, the WC-bar line is low, and the WT line is low. Thus, transistor TR10 is on and transistor TR12 is off and the complementary bit line BLC is driven to a logic high level (e.g., Vdd). During a Read 1, both the WC and WT lines are again low, the WC-bar line is high, and the complementary bit line BLC is floating. During a Write 1, the WC line is low, the WC-bar line is high, and the WT line is high. Thus, transistor TR10 is off and transistor TR12 is on and the complementary bit line BLC is driven to a logic low level (e.g., Vss).

Figure 5B:
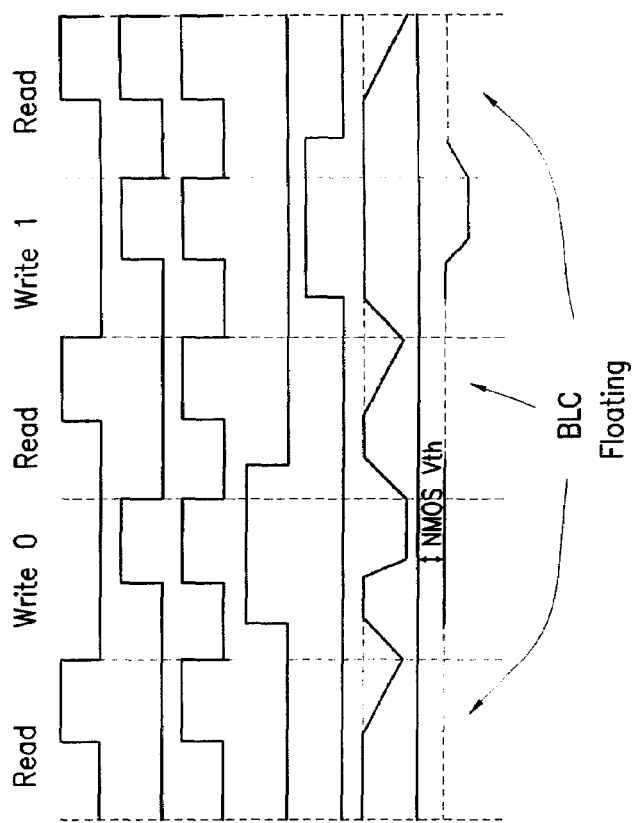
FIG. 5B is a graph illustrating timing relationships among numerous signals in the system of FIG. 5A.
Figure 5A:
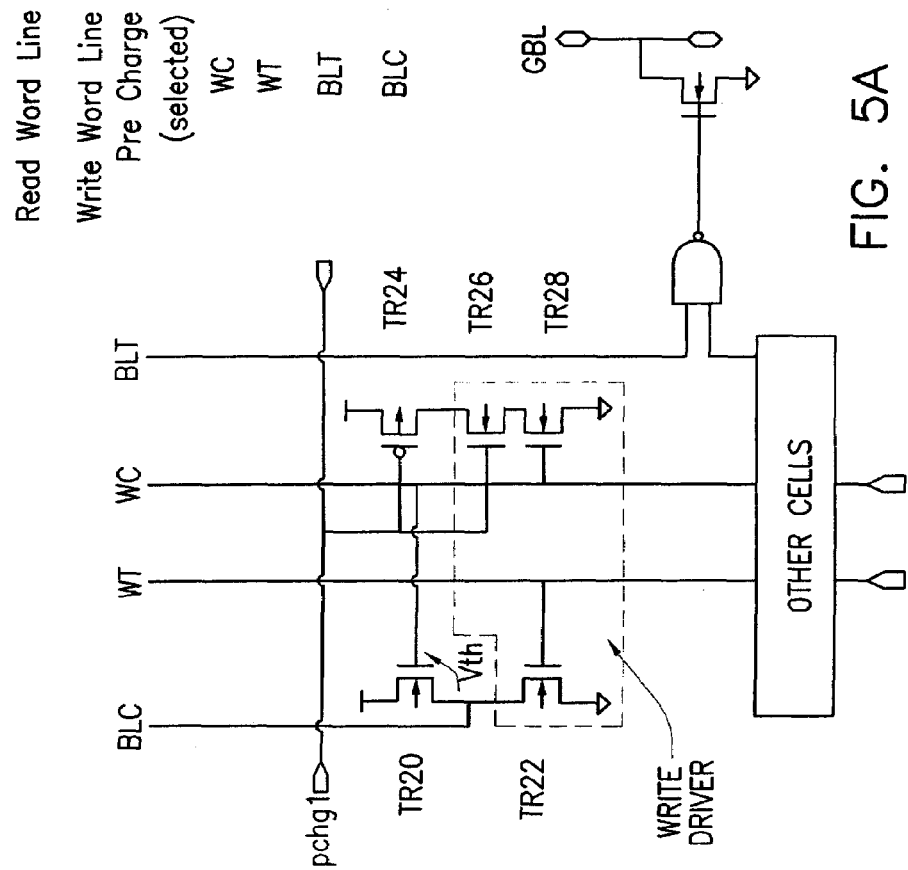
FIG. 5A is a block diagram illustrating an alternative local evaluation circuit suitable for use in an SRAM memory of any of the embodiments herein in accordance with one or more further embodiments of the present invention.

Reference is now made to FIG. 5A, which is a detailed circuit diagram and block diagram of the memory system 100 in accordance with a further embodiment of the present invention. Again, the circuit details of the SRAM memory cell 102 are omitted for purposes of brevity and clarity. In this embodiment, an alternative circuit configuration for the evaluation circuitry (the feedback, pre-charge, and write driver circuits) is provided. Again, the evaluation circuit is implemented using a plurality of NMOS and PMOS transistors, and in operation, the evaluation circuit permits the complementary bit line BLC to float (driven to neither the Vdd nor Vss potential) during Read 0 and Read 1 operations. In this embodiment, the floating potential is about a threshold voltage (Vth) of an NMOS transistor. Again, the floating of the complementary bit line BLC during read operations prevents the complementary bit line BLC from swinging, thereby reducing power consumption and dissipation.

This embodiment of the evaluation circuit includes NMOS transistor TR20, NMOS transistor TR22, PMOS transistor TR24, NMOS transistor TR26, and NMOS transistor TR26. Transistor TR20 is coupled from Vdd to the complementary bit line BLC, and transistor TR22 is coupled from the complementary bit line BLC to Vss (in this case ground). Transistor TR20 is controlled by the WC signal, while transistor TR22 is controlled by the WT signal. Transistor TR24 is coupled from Vdd to the bit line BLT, and transistors TR26 and TR28 are coupled in series from the bit line BLT to ground. Both transistors TR24 and TR26 are controlled by the pre-charge signal (pchg1), while transistor TR28 is controlled by the WC signal.

With reference to FIG. 5B, during a Read 0, both the WC and WT lines are low. Thus, transistors TR20 and TR22 are off and the complementary bit line BLC is floating at about one threshold voltage below Vdd, specifically the threshold voltage of NMOS transistor TR20. During a Write 0, the WC line is high and the WT line is low. Thus, transistor TR20 is on and transistor TR22 is off and the complementary bit line BLC is driven to a logic high level (e.g., about Vdd), which is actually also one threshold voltage level below Vdd. During a Read 1, both the WC and WT lines are again low and the complementary bit line BLC is floating. During a Write 1, the WC line is low and the WT line is high. Thus, transistor TR20 is off and transistor TR22 is on and the complementary bit line BLC is driven to a logic low level (e.g., Vss).

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An SRAM cell, comprising:
   an anti-parallel storage circuit operable to store a logic high or low value across a true node and a complementary node;
   at least one first transistor coupled between the true node and a true bit line (BLT) of the SRAM cell; and
   at least one second transistor coupled between the complementary node and a complementary bit line (BLC) of the SRAM cell,
   wherein the first and second transistors are controlled by separate signals such that the complementary bit line (BLC) does not substantially drop from a pre-charge level during operations in which a logic one is read from the anti-parallel storage circuit.

2. The SRAM cell of claim 1, wherein the second transistor is controlled by a write word line (WWL) that turns the second transistor on only during operations in which a logic value is written into the anti-parallel storage circuit.

3. The SRAM cell of claim 2, wherein the first transistor is controlled by a read-write word line (RWWL) that turns the first transistor on during operations in which a logic value is written into, or read from, the anti-parallel storage circuit.

4. An SRAM memory system, comprising:
   a plurality of memory cells arranged in an array of rows (word lines) and columns (bit lines);
   an anti-parallel storage circuit located in each memory cell and operable to store a logic high or low value across a true node and a complementary node;
   a set of first transistors, each first transistor coupled between the true node and a true bit line (BLT) of a respective SRAM memory cell; and
   a set of second transistors, each second transistor coupled between the complementary node and a complementary bit line (BLC) of a respective SRAM memory cell,
   wherein the sets of first and second transistors are controlled by separate signals such that the complementary bit line (BLC) of the respective memory cells does not substantially drop from a pre-charge level during operations in which a logic one is read from the anti-parallel storage circuit.

5. An SRAM memory system, comprising:
   a plurality of memory cells arranged in an array of rows (word lines) and columns (bit lines);
   an anti-parallel storage circuit located in each memory cell and operable to store a logic high or low value across a true node and a complementary node, the true node and the complementary node receiving data from and providing data to a true bit line (BLT) and a complementary bit line (BLC), respectively; and
   a plurality of evaluation circuits, each operable to provide at least one of pre-charge, write driver, and feedback functions to an associated memory cell or group of memory cells,
   wherein at least one of the evaluation circuits is operable to prevent the complementary bit line (BLC) of an associated one of the memory cell from substantially dropping from a pre-charge level during operations in which a logic one is read from the anti-parallel storage circuit.

6. The SRAM memory system of claim 5, wherein the at least one evaluation circuit is operable to cause the complementary bit line (BLC) of the associated memory cell to float during operations in which a logic one is read from the anti-parallel storage circuit.

7. The SRAM memory system of claim 6, wherein the at least one evaluation circuit is operable to cause the complementary bit line (BLC) to float at a potential between a supply voltage, Vdd, and a ground potential, Vss.

8. The SRAM memory system of claim 7, wherein the floating potential is about half of the difference of Vdd and Vss.

9. The SRAM memory system of claim 7, wherein the floating potential is about a voltage threshold level below Vdd.

10. A method, comprising:

writing data into and reading data from an anti-parallel storage circuit of an SRAM memory cell via a true bit line (BLT) and a complementary bit line (BLC); and preventing the complementary bit line (BLC) from substantially dropping from a pre-charge level during operations in which a logic one is read from the anti-parallel storage circuit.

11. The method of claim 10, further comprising causing the complementary bit line (BLC) to float during the operations in which a logic one is read from the anti-parallel storage circuit.

12. The method of claim 11, wherein the floating potential is between a supply voltage, Vdd, and a ground potential, Vss.

13. The method of claim 12, wherein the floating potential is about half of the difference of Vdd and Vss.

14. The method of claim 12, wherein the floating potential is about a voltage threshold level below Vdd.

* * * * *